(12) United States Patent
Saito

(10) Patent No.: US 11,456,214 B2
(45) Date of Patent: Sep. 27, 2022

(54) METHOD OF PROCESSING WORKPIECE

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 141 days.

(21) Appl. No.: 17/017,312

(22) Filed: Sep. 10, 2020

(65) Prior Publication Data

US 2021/0082764 A1    Mar. 18, 2021

(30) Foreign Application Priority Data

Sep. 13, 2019 (JP) .............................. JP2019-167280

(51) Int. Cl.
| | |
|---|---|
| *H01L 21/00* | (2006.01) |
| *H01L 21/683* | (2006.01) |
| *H01L 23/31* | (2006.01) |
| *H01L 21/46* | (2006.01) |
| *H01L 21/78* | (2006.01) |

(52) U.S. Cl.
CPC .......... *H01L 21/78* (2013.01); *H01L 21/6836* (2013.01)

(58) Field of Classification Search
CPC ......... H01L 24/29; H01L 21/68; H01L 24/27; H01L 21/78; H01L 21/6836
See application file for complete search history.

(56) References Cited

U.S. PATENT DOCUMENTS

| | | | | |
|---|---|---|---|---|
| 2008/0076210 A1* | 3/2008 | Harada | ................. | H01L 21/561 438/464 |
| 2015/0348821 A1* | 12/2015 | Iwanaga | ................. | H01L 21/78 257/798 |
| 2016/0268154 A1* | 9/2016 | Hiraoka | ............ | H01L 23/49551 |
| 2018/0158713 A1* | 6/2018 | Okita | ................ | H01J 37/32715 |
| 2019/0164784 A1* | 5/2019 | Wongratanaporngoorn | ................ | H01L 21/67092 |
| 2019/0221479 A1* | 7/2019 | Okita | ................. | H01J 37/32403 |

FOREIGN PATENT DOCUMENTS

| | | |
|---|---|---|
| JP | 2006049591 A | 2/2006 |
| JP | 2008283056 A | 11/2008 |
| JP | 2014063812 A | 4/2014 |
| WO | 2019172439 A1 | 9/2019 |

OTHER PUBLICATIONS

Search report issued in counterpart Singapore patent application No. 10202008577R, dated Aug. 20, 2021.

* cited by examiner

*Primary Examiner* — Brian Turner
(74) *Attorney, Agent, or Firm* — Greer Burns & Crain Ltd.

(57) ABSTRACT

A method of processing a workpiece includes a thermosetting step of heating an area of an expandable sheet around a workpiece to a predetermined temperature or higher and thereafter cooling the heated area of the expandable sheet to make the area harder than before the area has been heated, and after the thermosetting step, an expanding step of expanding the area of the expandable sheet around the workpiece in planar directions to divide the workpiece into chips or to increase distances between the adjacent chips.

7 Claims, 8 Drawing Sheets

METHOD OF PROCESSING WORKPIECE

BACKGROUND OF THE INVENTION

Field of the Invention

The present invention relates to a method of processing a workpiece.

Description of the Related Art

Disc-shaped workpieces such as semiconductor wafers or the like with a large number of devices formed on face sides are divided along projected dicing lines between the devices into individual semiconductor chips. There is known in the related art a technology according to which a workpiece fixed to an expandable sheet that closes an opening in an annular frame is divided into chips by expanding the expandable sheet. There is also known in the related art a technology according to which a workpiece that has been divided into chips by dicing, dicing before grinding (DBG), or the like is secured to an annular frame by an expandable sheet, and thereafter, the expandable sheet is expanded to increase the distances between the adjacent chips. According to a known expanding process used in the above technologies, the expandable sheet is expanded by pushing the workpiece upwardly in a direction away from the annular frame while the annular frame is being held in place (see, for example, Japanese Patent Laid-Open No. 2006-049591).

SUMMARY OF THE INVENTION

The above expanding process has been problematic in that, since the area of the expandable sheet that lies on its own radially outwardly of the workpiece is more stretchable than the area of the expandable sheet that is affixed to the workpiece, the expansion of the expandable sheet fails to contribute sufficiently to dividing the workpiece and forming intervals between the adjacent chips. In view of these shortcomings, it has been proposed to expand an expandable sheet in four directions before the expandable sheet is secured to an annular frame. However, as the proposed process requires that the expandable sheet be secured to the annular frame after the expandable sheet has been expanded, the proposed process is not applicable to cases where an expandable sheet has been secured to an annular frame in advance.

It is therefore an object of the present invention to provide a method of processing a workpiece for promoting expansion of the area of an expandable sheet that is affixed to a workpiece when the expandable sheet supporting the workpiece is expanded.

In accordance with an aspect of the present invention, there is provided a method of processing a plate-shaped workpiece that has division initiating points formed therein along projected dicing lines thereon or that has been divided into a plurality of chips, the workpiece being disposed in an opening of an annular frame and supported on an expandable sheet having a thermosetting property and fixed to the annular frame, thereby making up a frame unit, the expandable sheet being expanded to divide the workpiece into individual chips from the division initiating points or to increase distances between the adjacent chips. The method of processing a plate-shaped workpiece includes a thermosetting step of heating an area of the expandable sheet around the workpiece to a predetermined temperature or higher and thereafter cooling the heated area of the expandable sheet to make the area harder than before the area has been heated, and after the thermosetting step, an expanding step of expanding the area of the expandable sheet around the workpiece in planar directions to divide the workpiece into the chips or to increase distances between the adjacent chips.

Preferably, the expandable sheet includes a base layer and an adhesive layer, the base layer or the adhesive layer being made of a thermosetting resin. Preferably, the thermosetting step is carried out on areas of the expandable sheet that exist in directions in which the expandable sheet is to be expanded more than in other directions.

Preferably, the method of processing a plate-shaped workpiece further includes, after the expanding step, a slack removing step of heating again the area of the expandable sheet around the workpiece that has been slacked to shrink the slacked area of the expandable sheet.

According to the present invention, expansion of the area of the expandable sheet that is affixed to the workpiece can be promoted when the expandable sheet supporting the workpiece is expanded.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will hereinafter be described in detail below with reference to the drawings. The present invention is not limited to the details of the embodiments described below. The components described below cover those which could easily be conceived by those skilled in the art and those which are essentially identical to those described above. Furthermore, the arrangements described below can be used in appropriate combinations. Various omissions, replacements, or changes of the arrangements may be made without departing from the scope of the present invention.

EMBODIMENT

Figure 1:
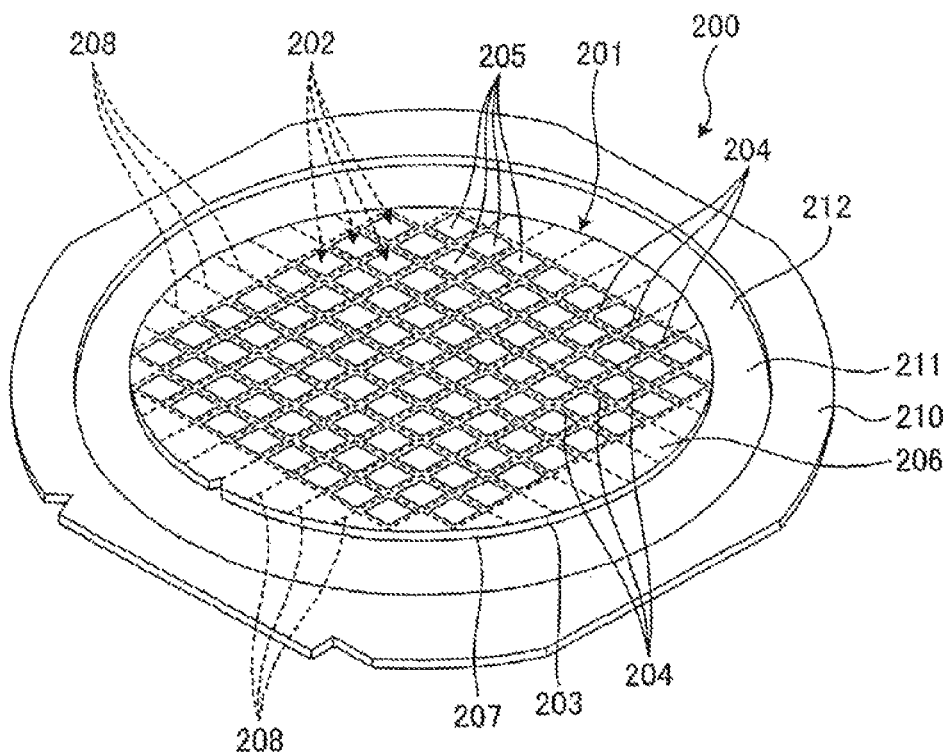
FIG. 1 is a perspective view illustrating by way of example a frame unit as a target to be processed by a method of processing a workpiece according to an embodiment of the present invention.
Figure 2:
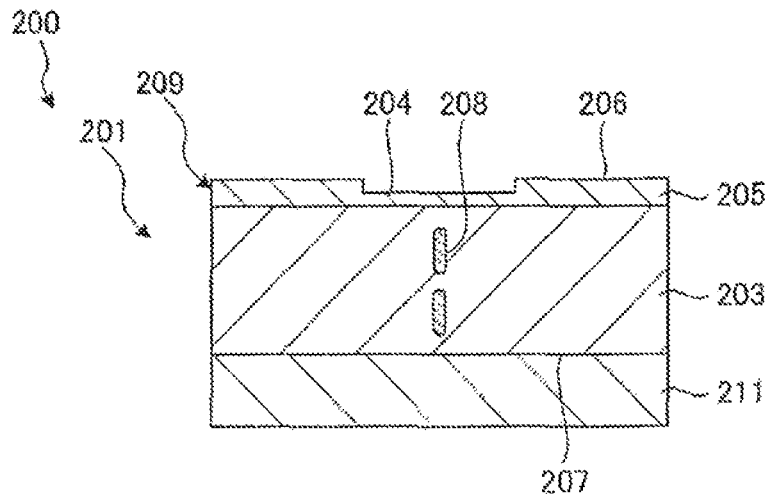
FIG. 2 is an enlarged fragmentary cross-sectional view of the frame unit illustrated in FIG. 1.
Figure 3:
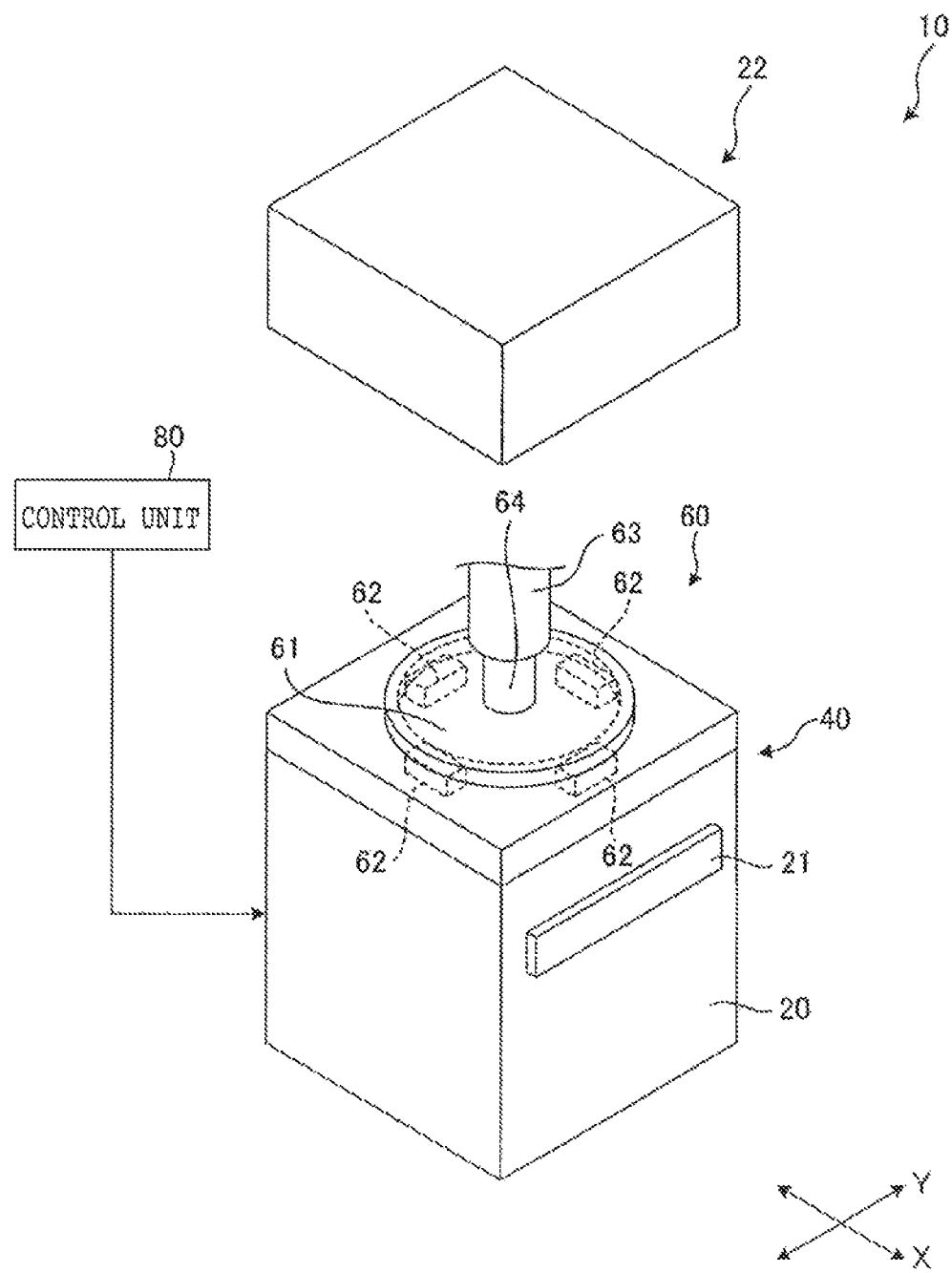
FIG. 3 is a perspective view illustrating a configuration example of an expanding apparatus used in the method of processing a workpiece according to the embodiment.
Figure 4:
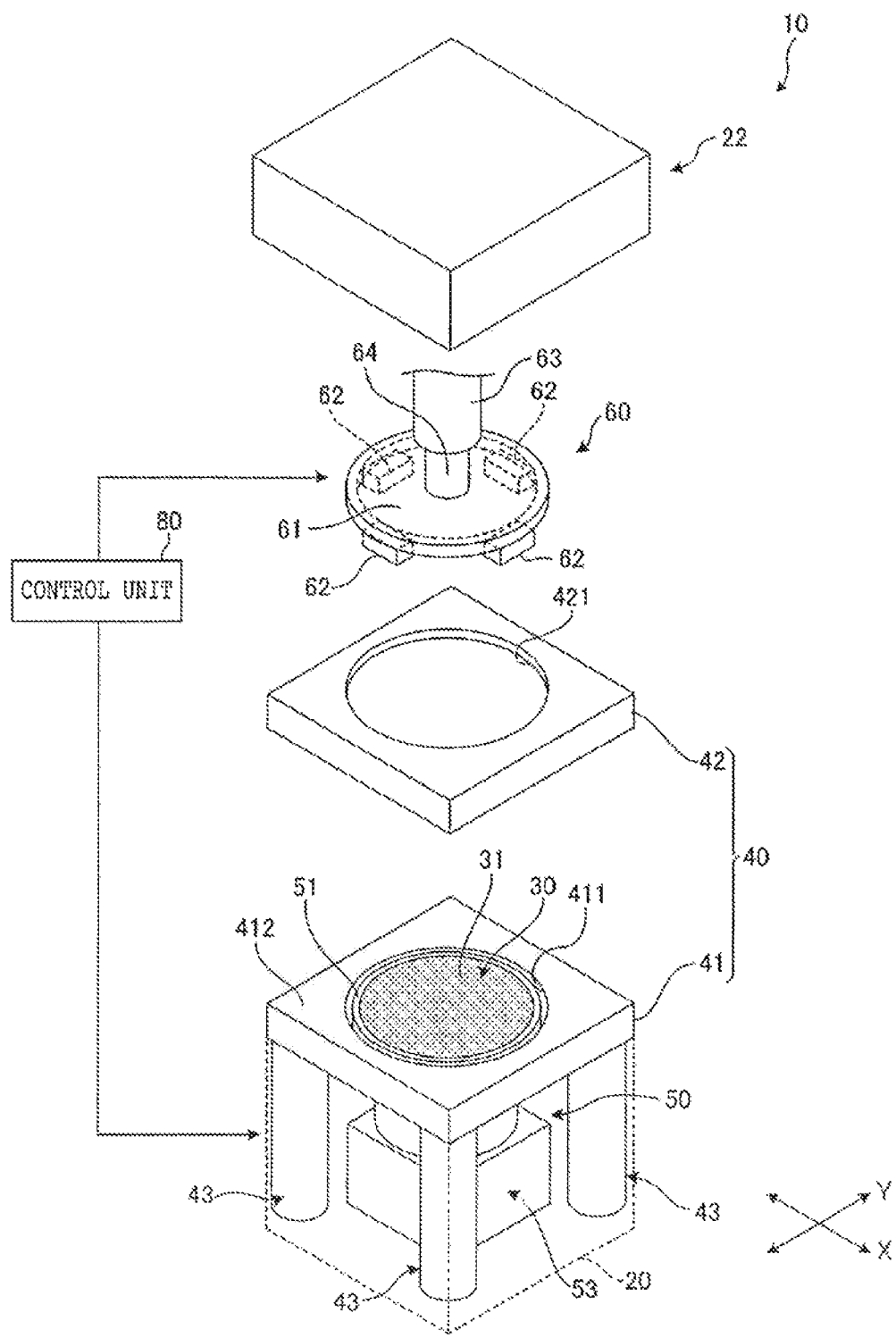
FIG. 4 is an exploded perspective view of the configuration example of the expanding apparatus illustrated in FIG. 3.

A method of processing a workpiece 201 according to an embodiment of the present invention will hereinafter be described below with reference to the drawings. First, a configuration of a frame unit 200 as a target to be processed according to the present embodiment and a configuration of an expanding apparatus 10 used in the method of processing the workpiece 201 will be described below. FIG. 1 illustrates by way of example the frame unit 200 as a target to be processed by the method of processing the workpiece 201 according to the embodiment. FIG. 2 illustrates in enlarged fragmentary cross section the frame unit 200 illustrated in FIG. 1. FIG. 3 illustrates in perspective a configuration example of the expanding apparatus 10 used in the method of processing the workpiece 201 according to the embodiment. FIG. 4 illustrates in exploded perspective the configuration example of the expanding apparatus 10 illustrated in FIG. 3.

The workpiece 201 as a target to be processed according to the embodiment is divided into a plurality of chips 202 illustrated in FIG. 1 by the expanding apparatus 10 illustrated in FIGS. 3 and 4. The workpiece 201 according to the embodiment will hereinafter be described as being divided by the expanding apparatus 10 into the chips 202 along modified layers 208 formed in the workpiece 201. The workpiece 201 is in the form of a wafer such as a disc-shaped semiconductor wafer, an optical device wafer, or the like including a substrate 203 of silicon (Si), sapphire ($Al_2O_3$), gallium arsenide (GaAs), silicon carbide (SiC), or the like. The workpiece 201 includes a plurality of projected dicing lines 204 formed on a face side 206 of the substrate 203 and a plurality of devices 205 formed in respective areas demarcated on the face side 206 by the projected dicing lines 204 that intersect with each other in a grid pattern.

As illustrated in FIG. 2, the workpiece 201 includes a function layer 209 deposited on a face side of the substrate 203. According to the embodiment, the function layer 209 includes low-dielectric-constant insulating films (hereinafter referred to as "low-k films") such as films of an inorganic substance such as SiOF, BSG (SiOB), or the like or films of an organic substance as polymer films such as of a polyimide-based or parylene-based polymer, and an electrically conductive film of electrically conductive metal. The low-k films and the electrically conductive film are layered together into the devices 205. The electrically conductive film provides circuits of the devices 205. Specifically, the devices 205 include the low-k films that are layered together and the electrically conductive film that is layered between the low-k films. The function layer 209 in the projected dicing lines 204 include the low-k films and is free of the electrically conductive film except in test element groups (TEGs). The TEGs refer to assessment elements for spotting a design problem or a production problem that may occur in the devices 205.

The workpiece 201 is supported on an annular frame 210 by an expandable sheet 211. The annular frame 210 has an opening larger in diameter than the workpiece 201. The expandable sheet 211 has an outer circumferential edge portion affixed to a reverse side of the annular frame 210. The workpiece 201 is positioned at a predetermined position in the opening of the annular frame 210 and has a reverse side 207 affixed to the expandable sheet 211. The workpiece 201 is thus secured to the expandable sheet 211 and secured to the annular frame 210 by the expandable sheet 211.

The expandable sheet 211 is made of an extensible and contractible resin, and has a thermosetting property by which it is cured when heated and cooled and a thermoshrinking property by which it is shrunk when heated. The expandable sheet 211 may include a base layer made of an extensible and contractible synthetic resin, and an adhesive layer layered on the base layer and made of an extensible and contractible and adhesive synthetic resin, for example. At least either one of the base layer or the adhesive layer is made of a thermosetting resin. The expandable sheet 211 may be mixed with an antioxidant.

According to the embodiment, the expandable sheet 211 is affixed to the reverse side 207 of the workpiece 201 to secure the workpiece 201 in position. According to the present invention, however, the expandable sheet 211 may be affixed to the face side 206 of the workpiece 201 to secure the workpiece 201 in position. Furthermore, a die-attach film may be interposed between the expandable sheet 211 and the workpiece 201.

When a laser beam having a wavelength transmittable through the substrate 203 is applied from the reverse side 207 side to the workpiece 201 along the projected dicing lines 204, modified layers 208 are formed as division initiating points along the projected dicing lines 204 within the substrate 203. The modified layers 208 refer to regions where density, refractive index, mechanical strength, or other physical properties are different from those in surrounding regions. The modified layers 208 represent, for example, melted regions, cracked regions, dielectric breakdown regions, varied refractive index regions, or regions where those regions are present together. According to the embodiment, the modified layers 208 have a less mechanical strength than the other regions of the substrate 203.

The workpiece 201 with the modified layers 208 formed therein along the projected dicing lines 204, the expandable sheet 211 affixed to the reverse side 207 of the workpiece 201, and the annular frame 210 to which the outer circumferential edge portion of the expandable sheet 211 is affixed jointly make up the frame unit 200. In other words, the frame unit 200 includes the workpiece 201, the expandable sheet 211, and the annular frame 210.

When external forces are applied to the workpiece 201 with the modified layers 208 formed therein, the workpiece 201 is divided along modified layers 208 beneath the projected dicing lines 204 into the individual chips 202 incorporating the respective devices 205. The chips 202 include respective portions of the substrate 203 and the respective devices 205 disposed on the respective portions of the substrate 203. According to the embodiment, the chips 202 are of a square shape as viewed in plan. According to the present invention, the chips 202 may be of a rectangular shape as viewed in plan.

The external forces applied to divide the workpiece 201 into the individual chips 202 are produced by the expanding apparatus 10 illustrated in FIGS. 3 and 4. The expanding apparatus 10 includes a chamber 20, a chuck table 30, a frame holder 40, a chip interval forming unit 50, a heating unit 60, and a control unit 80. X directions and Y directions illustrated in FIGS. 3 and 4 are included in horizontal directions and extend perpendicularly to each other.

The chamber 20 is shaped as a box having an upper opening. The chamber 20 houses therein the chuck table 30, a frame rest plate 41 of the frame holder 40, and the chip interval forming unit 50. The chamber 20 has a loading/unloading slot, not shown, for loading and unloading the frame unit 200 therethrough, the loading/unloading slot being openable and closable by an opening/closing lid 21. The upper opening of the chamber 20 is closed by a lid 22 that covers the heating unit 60 from above.

The chamber 20 should preferably be hermetically sealed with the upper opening closed by the lid 22 and the loading/unloading slot closed by the opening/closing lid 21. The expanding apparatus 10 may include a nitrogen supply source for supplying an inactive gas of nitrogen to the chamber 20. By introducing nitrogen into the chamber 20 to purge oxygen from the chamber 20, the expandable sheet 211 is kept out of contact with oxygen and hence prevented from being degraded by oxygen when heated and cooled in a thermosetting step ST1 to be described later.

The chuck table 30 holds the chips 202 under suction on a holding surface 31 thereof through the expandable sheet 211 while the chips 202 remain spaced at increased intervals therebetween. The chuck table 30 is shaped as a circular plate or disc. The chuck table 30 has the holding surface 31 for holding under suction thereon the workpiece 201 of the frame unit 200 through the expandable sheet 211. The holding surface 31 is made of a porous material such as porous ceramic or the like. A vacuum suction source, not shown, is held in communication with the holding surface 31 to apply suction forces or a vacuum to the holding surface 31.

The frame unit 200 is delivered to the chuck table 30 by a delivery unit, not shown. On the chuck table 30, the reverse side 207 of the workpiece 201 is placed on the holding surface 31 through the expandable sheet 211 of the frame unit 200. When suction forces are applied from the vacuum suction source to the holding surface 31, the chuck table 30 can hold the reverse side 207 of the workpiece 201 under suction on the holding surface 31.

The frame holder 40 holds and secures the annular frame 210 of the frame unit 200. The frame holder 40 includes the frame rest plate 41 and a frame pressing plate 42.

The frame rest plate 41 has an opening 411 defined therein that is of a circular shape as viewed in plan and is in the form of a square plate having an upper surface 412 lying flat parallel to horizontal directions. The frame rest plate 41 is vertically fixed in position by its four corners supported by respective legs 43 disposed in the chamber 20. The inside diameter of the opening 411 in the frame rest plate 41 is equal to the inside diameter of the annular frame 210. The chuck table 30 is disposed in the opening 411 in the frame rest plate 41. The opening 411 is coaxial with the chuck table 30. The annular frame 210 of the frame unit 200 that is delivered by the delivery unit, not shown, is placed on the upper surface 412 of the frame rest plate 41.

The frame pressing plate 42 is in the form of a square plate having substantially the same dimensions as the frame rest plate 41. The frame pressing plate 42 has a circular opening 421 defined centrally therein that is of the same dimension as the opening 411. The frame pressing plate 42 is fixed in the chamber 20. The frame holder 40 secures the annular frame 210 in position by sandwiching the annular frame 210 between the frame rest plate 41 and the frame pressing plate 42.

The chip interval forming unit 50 expands the expandable sheet 211 by moving the workpiece 201 with respect to the frame holder 40 in a vertical direction perpendicular to the face side 206 of the workpiece 201. By expanding the expandable sheet 211, the chip interval forming unit 50 divides the workpiece 201 along the projected dicing lines 204 into the chips 202, increasing the intervals between the adjacent chips 202 to desired distances. The chip interval forming unit 50 gas a table lifting and lowering unit 53 and a push-up member 51. The table lifting and lowering unit 53 moves the chuck table 30 in vertical directions perpendicular to the holding surface 31.

Figure 6:
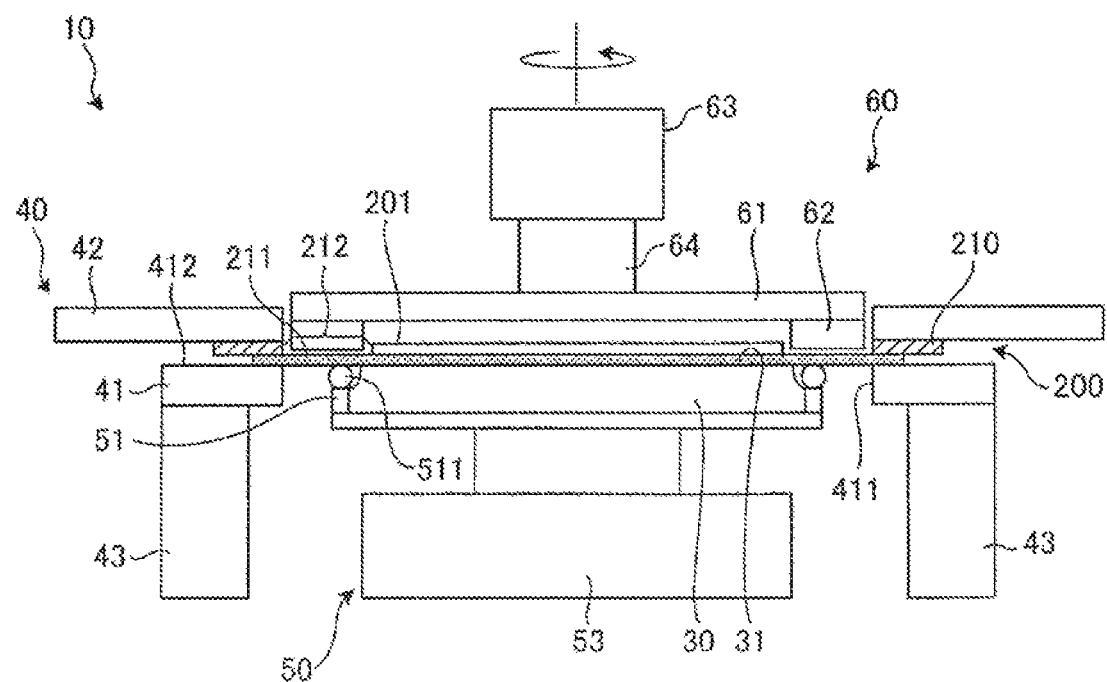
FIG. 6 is a cross-sectional view illustrating a portion of the expanding apparatus that is in a state in a thermosetting step of the method of processing a workpiece illustrated in FIG. 5.
Figure 7:
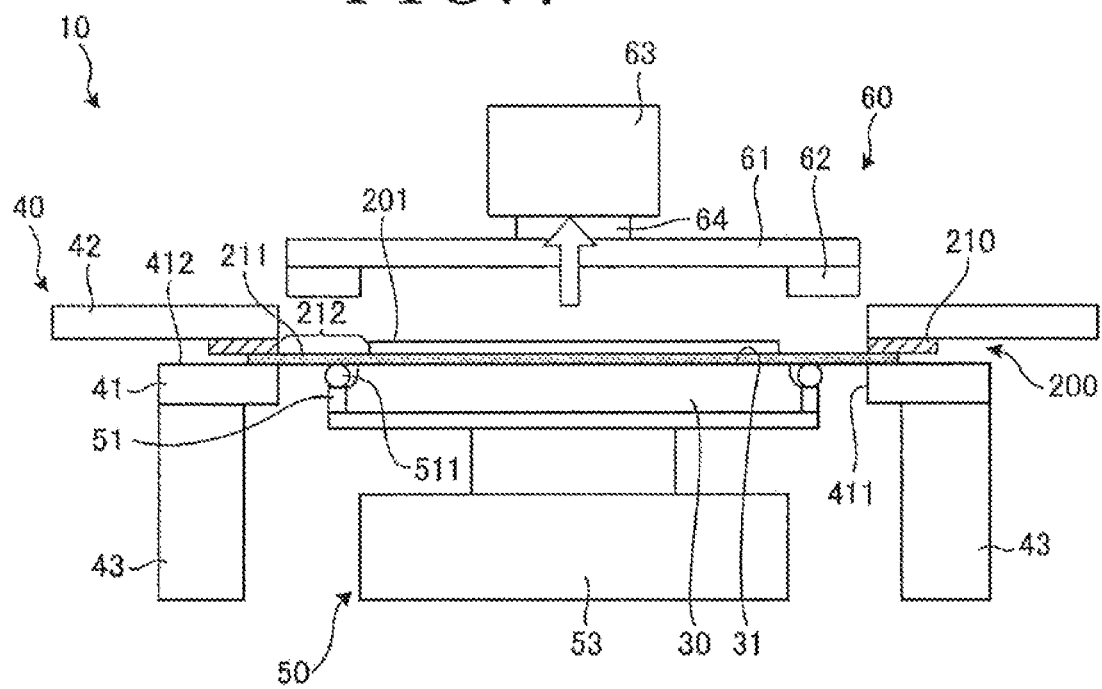
FIG. 7 is a cross-sectional view illustrating the portion of the expanding apparatus that is in a state subsequent to the state illustrated in FIG. 6 in the thermosetting step of the method of processing a workpiece illustrated in FIG. 5.
Figure 8:
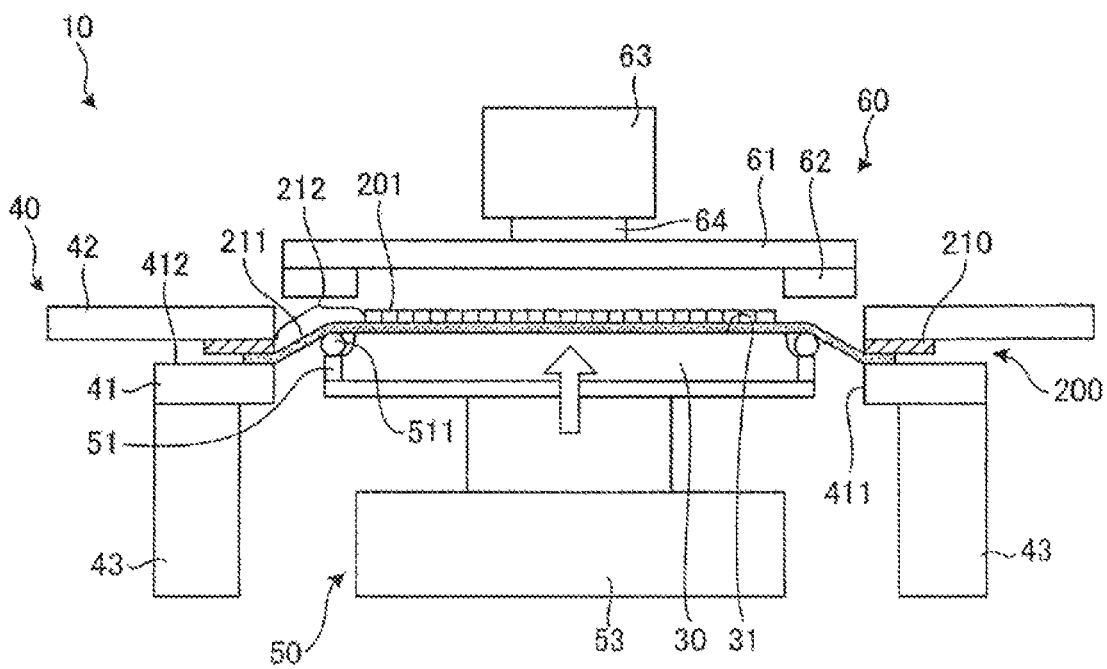
FIG. 8 is a cross-sectional view illustrating the portion of the expanding apparatus after an expanding step of the method of processing a workpiece illustrated in FIG. 5.

The push-up member 51 is of a hollow cylindrical shape. The push-up member 51 has an outside diameter smaller than the inside diameter of the annular frame 210 that is placed on the upper surface 412 of the frame rest plate 41. The push-up member 51 has an inside diameter larger than the diameters of the workpiece 201 affixed to the expandable sheet 211 and the chuck table 30. The push-up member 51 is disposed radially outwardly of the chuck table 30 that is disposed radially inwardly of the push-up member 51. The push-up member 51 is disposed coaxially with the chuck table 30. Rollers 511, shown in FIGS. 6 through 8, are rotatably mounted on an upper end of the push-up member 51 and disposed in a plane lying flush with the holding surface 31 of the chuck table 30. The rollers 511 reduce friction between the push-up member 51 and the expandable sheet 211 when the push-up member 51 pushes the expandable sheet 211 upwardly. According to the embodiment, the push-up member 51 is lifted and lowered in unison with the chuck table 30 by the table lifting and lowering unit 53.

The expandable sheet 211 is expanded in planar directions when the rollers 511 and the holding surface 31 are lifted in union with each other from a position flush with the upper surface 412 of the frame rest plate 41. The table lifting and lowering unit 53 expands the expandable sheet 211 in the planar directions by lifting the push-up member 51 with the rollers 511 mounted on its upper end and the chuck table 30 having the holding surface 31, in unison with each other.

The heating unit 60 heats the area of the expandable sheet 211 that lies around the workpiece 201 to a predetermined temperature or higher. The heating unit 60 includes a disc-shaped unit body 61, a plurality of heat sources 62 mounted on the unit body 61, a rotating unit 63, and a lifting and lowering unit 64.

The unit body 61 is disposed above the chuck table 30 and coaxially with the chuck table 30. The unit body 61 can be rotated about a central axis parallel to the vertical directions by the rotating unit 63. The unit body 61 can be lifted and lowered by the lifting and lowering unit 64.

The heat sources 62 are disposed at equal angular intervals circumferentially on an outer marginal edge portion of the unit body 61. The heat sources 62 are disposed in respective positions that vertically face an annular area 212 of the expandable sheet 211 that extends between an inner edge of the annular frame 210 and an outer edge of the workpiece 201 as the frame unit 200 is held by the chuck table 30 and the frame holder 40. The heat sources 62 locally heat the annular area 212 of the expandable sheet 211 that extends between the inner edge of the annular frame 210 and the outer edge of the workpiece 201. According to the embodiment, the heating unit 60 is illustrated as having four heat sources 62. According to the present invention, however, the number of heat sources 62 may not necessarily be limited to four. According to the embodiment, the heat sources 62 are of the type radiating infrared rays downwardly to heat the annular area 212 of the expandable sheet 211, e.g., infrared ceramic heaters for radiating infrared rays when heated by a voltage applied thereto. According to the present invention, however, the heat sources 62 are not limited to such infrared heaters.

The rotating unit 63 moves the heat sources 62 circumferentially around the workpiece 201. According to the embodiment, the rotating unit 63 rotates the unit body 61 to move heat sources 62 circumferentially around the workpiece 201. However, the heat sources 62 may be moved circumferentially relatively to the unit body 61.

The lifting and lowering unit 64 adjusts the distance between the heat sources 62 of the heating unit 60 and the expandable sheet 211. According to the embodiment, the lifting and lowering unit 64 lifts and lowers the unit body 61 to adjust the distance between the heat sources 62 and the expandable sheet 211. However, the heat sources 62 may be moved vertically relatively to the unit body 61.

The control unit 80 controls the components described above of the expanding apparatus 10, i.e., the chip interval forming unit 50 and the heating unit 60, etc. to enable the expanding apparatus 10 to process the workpiece 201. The control unit 80 is a computer, for example, having an arithmetic processing device having a microprocessor such as a central processing unit (CPU), a storage device having a memory such as a read only memory (ROM) or a random access memory (RAM), and an input/output interface device. The control unit 80 is connected to a display unit, not shown, such as a liquid crystal display device for displaying states of processing operation, images, etc., and an input unit, not shown, used by the operator for registering processing detail information, etc. The input unit includes at least one of external input devices including a touch panel incorporated in the display unit, a keyboard, etc.

The control unit 80 controls, for example, the heating unit 60 to apply a voltage to the heat sources 62 to heat the heat sources 62 to a predetermined temperature. The control unit 80 controls, for example, the rotating unit 63 to move the heat sources 62 circumferentially around the workpiece 201. The control unit 80 controls, for example, the lifting and lowering unit 64 to adjust the distance between the heat sources 62 and the expandable sheet 211. While the heating unit 60 is heating the expandable sheet 211, the control unit 80 may control the lifting and lowering unit 64 to lift and lower the heat sources 62 to adjust the amount of heat applied to the expandable sheet 211.

The control unit 80 controls, for example, the chip interval forming unit 50 to move the chuck table 30 and the frame holder 40 between an expanded position and a proximity position. The expanded position refers to a position in which the chuck table 30 and the frame holder 40 are spaced from each other along their central axis, expanding the expandable sheet 211. More specifically, the expanded position represents positions of the chuck table 30 and the frame holder 40 at the time the holding surface 31 of the chuck table 30 and the upper surface 412 of the frame rest plate 41 of the frame holder 40 are spaced from each other along the central axis. The proximity position refers to a position in which the chuck table 30 and the frame holder 40 are close to each other. More specifically, the proximity position represents positions of the chuck table 30 and the frame holder 40 at the time the holding surface 31 of the chuck table 30 and the upper surface 412 of the frame rest plate 41 of the frame holder 40 lie flush with each other.

Figure 5:
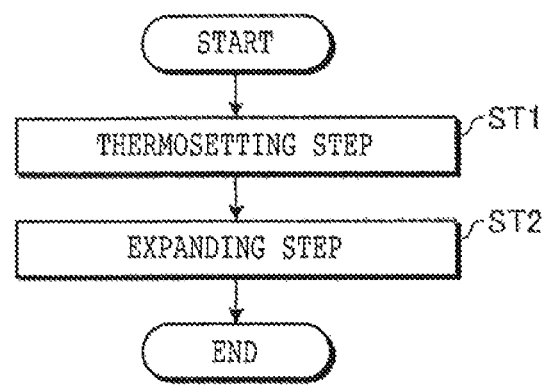
FIG. 5 is a flowchart of the sequence of the method of processing a workpiece according to the embodiment.

A method of expanding the expandable sheet 211 to divide the workpiece 201 along the projected dicing lines 204 into the plurality of chips 202, increasing the intervals between the adjacent chips 202 to desired distances, on the expanding apparatus 10 according to the embodiment will be described below. FIG. 5 is a flowchart of the sequence of the method of processing the workpiece 201 according to the embodiment. As illustrated in FIG. 5, the method of processing the workpiece 201 includes the thermosetting step ST1 and an expanding step ST2.

FIG. 6 illustrates in cross section a portion of the expanding apparatus 10 that is in a state in the thermosetting step ST1 of the method of processing the workpiece 201 illustrated in FIG. 5. The thermosetting step ST1 is a step of heating the area of the expandable sheet 211 around the workpiece 201 to a predetermined temperature or higher and then cooling the heated area to make it harder than before it has been heated.

According to the embodiment, in the thermosetting step ST1, the control unit 80 controls the opening/closing lid 21 (see FIG. 3) to open the loading/unloading slot of the chamber 20, and controls the delivery unit, not shown, to load the frame unit 200 with the modified layers 208 formed therein along the projected dicing lines 204 as illustrated in FIG. 2 through the loading/unloading slot into the chamber 20 in which the frame unit 200 is delivered to a position above the chuck table 30. Then, the control unit 80 controls the delivery unit to place the reverse side 207 of the workpiece 201 on the holding surface 31 with the expandable sheet 211 interposed therebetween and to place the annular frame 210 on the upper surface 412 of the frame rest plate 41.

Next, the control unit 80 controls the frame holder 40 to secure the annular frame 210 in position by sandwiching the annular frame 210 between the frame rest plate 41 and the frame pressing plate 42. The control unit 80 actuates the lifting and lowering unit 64 to lower the unit body 61 of the heating unit 60, bringing the heat sources 62 thereof closely to the expandable sheet 211. At this time, since the upper surface 412 of the frame rest plate 41, the holding surface 31 of the chuck table 30, and the rollers 511 mounted on the upper end of the push-up member 51 are positioned flush with each other, the rollers 511 abut against the annular area 212 of the expandable sheet 211.

Then, in the thermosetting step ST1, the annular area 212 of the expandable sheet 211 around the workpiece 201 is heated to a predetermined temperature or higher. The predetermined temperature is in the range from 60° C. to 100° C., for example. Specifically, the control unit 80 controls the heating unit 60 to apply a voltage to the heat sources 62, thereby heating the heat sources 62 to a predetermined temperature that is a preset constant temperature. The heated heat sources 62 radiate infrared rays. As illustrated in FIG. 6, the control unit 80 heats the heat sources 62 while keeping the heat sources 62 close to the annular area 212 of the expandable sheet 211. The control unit 80 also controls the rotating unit 63 to rotate the heating unit 60 about its central axis to move the heat sources 62 circumferentially along the annular area 212.

At this time, the control unit 80 may control the lifting and lowering unit 64 of the heating unit 60 under conditions preset by the operator. The control unit 80 controls the lifting and lowering unit 64 to lift and lower the unit body 61, thereby adjusting the vertical distance between the heat sources 62 and the expandable sheet 211. Specifically, the control unit 80 increases the amount of heat applied to the expandable sheet 211 by shortening the distance between the annular area 212 of the expandable sheet 211 and the heat sources 62 of the heating unit 60, or reduces the amount of heat applied to the expandable sheet 211 by increasing the distance between the annular area 212 of the expandable sheet 211 and the heat sources 62 of the heating unit 60. The control unit 80 may adjust the heating time during which the heating unit 60 heats the annular area 212 of the expandable sheet 211 under conditions preset by the operator.

FIG. 7 illustrates in cross section the portion of the expanding apparatus 10 that is in a state subsequent to the state illustrated in FIG. 6 in the thermosetting step ST1 of the method of processing the workpiece 201 illustrated in FIG. 5. Next in the thermosetting step ST1, the annular area 212 of the expandable sheet 211 around the workpiece 201 is cooled to make itself harder than before it has been heated. Specifically, the control unit 80 controls the heating unit 60 to stop heating the heat sources 62. As illustrated in FIG. 7, the control unit 80 controls the lifting and lowering unit 64 to lift the unit body 61 of the heating unit 60, spacing the heat sources 62 thereof away from the annular area 212 of the expandable sheet 211. According to the embodiment, in the thermosetting step ST1, the annular area 212 of the expandable sheet 211 is cooled by being left at the normal temperature for a predetermined period of time. Since the expandable sheet 211 has a thermosetting property, it is hardened when cooled after it has been heated. In other words, the annular area 212 of the expandable sheet 211 becomes harder than the area of the expandable sheet 211 that is affixed to the workpiece 201.

FIG. 8 illustrates in cross section the portion of the expanding apparatus 10 after the expanding step ST2 of the method of processing the workpiece 201 illustrated in FIG. 5. The expanding step ST2 is a step of expanding the expandable sheet 211 on and around the workpiece 201 in planar directions.

In the expanding step ST2, the chuck table 30 and the frame holder 40 are first moved along the central axis perpendicular to the face side 206 of the workpiece 201. Specifically, the control unit 80 controls the table lifting and lowering unit 53 of the chip interval forming unit 50 to lift the push-up member 51 and the chuck table 30 in unison with each other. At this time, since the expandable sheet 211 has an outer circumferential edge portion fixed between the frame rest plate 41 and the frame pressing plate 42, the annular area 212 of the expandable sheet 211 is expanded in the planar directions. Furthermore, as the rollers 511 on the upper end of the push-up member 51 reduce friction between the push-up member 51 and the expandable sheet 211, the expandable sheet 211 is expanded in its entirety in the planar directions. In the expanding step ST2, as a result of the expansion of the expandable sheet 211, radial tensile forces act on the expandable sheet 211.

When the radial tensile forces act on the expandable sheet 211 that is affixed to the reverse side 207 of the workpiece 201, the workpiece 201 is divided along the projected dicing lines 204 from the modified layers 208 illustrated in FIG. 2 that act as division initiating points. Gaps or spaced intervals are thus formed in the workpiece 201 between the adjacent devices 205, dividing the workpiece 201 into the plurality of chips 202. At this time, since the annular area 212 of the expandable sheet 211 is harder than the area of the expandable sheet 211 that is affixed to the workpiece 201, subsequent expansion of the annular area 212 of the expandable sheet 211 is limited whereas subsequent expansion of the area of the expandable sheet 211 that is affixed to the workpiece 201 is promoted.

In the method of processing the workpiece 201 according to the embodiment, as described above, before the expandable sheet 211 is expanded, the annular area 212 of the expandable sheet 211 around the workpiece 201 is heated and cooled for curing until it is made harder by curing than before it has been heated. The expansion of the area of the expandable sheet 211 that is affixed to the workpiece 201 is thus promoted.

(First Modification)

Figure 9:
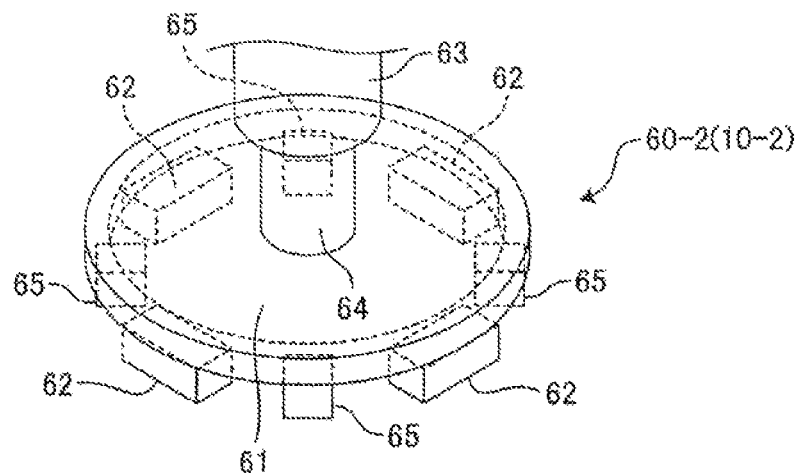
FIG. 9 is a perspective view illustrating a configuration example of a heating and cooling unit of an expanding apparatus used in a method of processing a workpiece according to a first modification.

A method of processing the workpiece 201 according to a first modification of the present invention will be described below with reference to the drawings. FIG. 9 illustrates in perspective a configuration example of a heating and cooling unit 60-2 of an expanding apparatus 10-2 used in the method of processing the workpiece 201 according to the first modification. Those parts illustrated in FIG. 9 that are identical to those according to the embodiment are denoted by identical reference characters, and their description will be omitted below.

The expanding apparatus 10-2 used in the method of processing the workpiece 201 according to the first modification is different from the expanding apparatus 10 according to the embodiment illustrated in FIGS. 3 and 4 in that it includes a heating and cooling unit 60-2 instead of the heating unit 60. As with the heating unit 60, the heating and cooling unit 60-2 includes a unit body 61, heat sources 62, a rotating unit 63, and a lifting and lowering unit 64. The unit body 61, the heat sources 62, the rotating unit 63, and the lifting and lowering unit 64 of the heating and cooling unit 60-2 are structurally identical to the unit body 61, the heat sources 62, the rotating unit 63, and the lifting and lowering unit 64 of the heating unit 60, and their description will be omitted below. The heating and cooling unit 60-2 is different from the heating unit 60 in that it includes a plurality of cooling fans 65.

The cooling fans 65 are disposed at equal angular intervals circumferentially on an outer marginal edge portion of the unit body 61. The cooling fans 65 are disposed in respective positions that vertically face the annular area 212 of the expandable sheet 211 that extends between the inner edge of the annular frame 210 and the outer edge of the workpiece 201 as the frame unit 200 is held by the chuck table 30 and the frame holder 40. The cooling fans 65 sends air downwardly to locally cool the annular area 212 of the expandable sheet 211 that extends between the inner edge of the annular frame 210 and the outer edge of the workpiece 201. According to the first modification, the heating and cooling unit 60-2 is illustrated as having four cooling fans 65. According to the present invention, however, the number of cooling fans 65 may not necessarily be limited to four. Also, according to the first modification, the cooling fans 65 are illustrated as alternating with the heat sources 62 circumferentially on an outer edge portion of the unit body 61. However, the present invention is not limited to such a layout.

In the thermosetting step ST1 according to the first modification, as with thermosetting step ST1 according to the embodiment illustrated in FIG. 6, the annular area 212 of the expandable sheet 211 that lies around the workpiece 201 is heated to a predetermined temperature or higher. According to the embodiment, thereafter, the annular area 212 of the expandable sheet 211 is cooled by being left at the normal temperature for a predetermined period of time, as illustrated in FIG. 7, as described above. According to the first modification, however, the annular area 212 of the expandable sheet 211 is positively cooled. Specifically, the control unit 80 controls the heating and cooling unit 60-2 to stop heating the heat sources 62. Then, while the heat sources 62 of the heating and cooling unit 60-2 remain close to the annular area 212 of the expandable sheet 211, the control unit 80 controls the heating and cooling unit 60-2 to cause the cooling fans 65 to send air downwardly by applying a voltage to the cooling fans 65, for example. In the method of processing the workpiece 201 according to the first modification, inasmuch as the annular area 212 of the expandable sheet 211 is positively cooled by the air sent from the cooling fans 65, the time required by the thermosetting step ST1 is shortened.

After the thermosetting step ST1 according to the first modification has been carried out and before the expanding step ST2 is carried out, the control unit 80 controls the lifting and lowering unit 64 to lift the unit body 61 of the heating and cooling unit 60-2. Alternatively, the control unit 80 may control the lifting and lowering unit 64 to lift the unit body 61 of the heating and cooling unit 60-2 simultaneously when the push-up member 51 and the chuck table 30 are lifted in the expanding step ST2.

(Second Modification)

Figure 10:
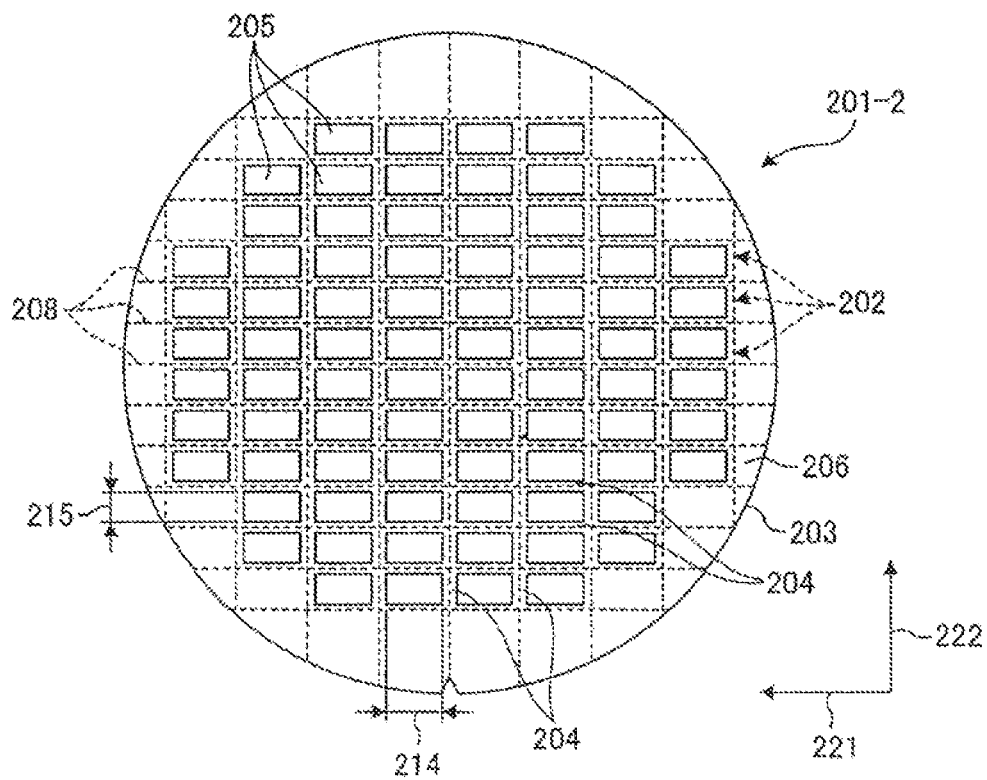
FIG. 10 is a plan view illustrating by way of example a workpiece as a target to be processed by a method of processing a workpiece according to a second modification.

A method of processing a workpiece 201-2 according to a second modification of the present invention will be described below with reference to the drawings. FIG. 10 illustrates in plan by way of example the workpiece 201-2 as a target to be processed by the method of processing the workpiece 201-2 according to the second modification. Those parts illustrated in FIG. 10 that are identical to those according to the embodiment are denoted by identical reference characters, and their description will be omitted below.

The workpiece 201-2 is divided into the individual chips 202 along the projected dicing lines 204 from the modified layers 208 that act as division initiating points. The workpiece 201-2 has devices 205 formed thereon that are of a rectangular shape each. Each of the devices 205 has a longitudinal length 214 larger than a transverse length 215 thereof. On the workpiece 201-2, the number of the projected dicing lines 204 that extend parallel to a first direction 221 parallel to the longitudinal directions of the devices 205 is larger than the number of the projected dicing lines 204 that extend parallel to a second direction 222 parallel to the transverse directions of the devices 205. When the expandable sheet 211 is expanded, since the chips 202 are spaced from each other in directions perpendicular to the projected dicing lines 204, the expandable sheet 211 is expanded to a larger extent in directions perpendicular to the projected dicing lines 204 of the larger-number group. On the workpiece 201-2 according to the second modification, the number of the projected dicing lines 204 perpendicular to the second direction 222 is larger than the number of the projected dicing lines 204 perpendicular to the first direction 221. Therefore, when the expandable sheet 211 of the frame unit 200 including the workpiece 201-2 is expanded, the expandable sheet 211 is expanded to a larger extent in the second direction 222 than it is expanded in the first direction 221.

In the thermosetting step ST1 of the method of processing the workpiece 201-2 according to the second modification, the control unit 80 first controls the heating unit 60 to heat portions of the annular area 212 of the expandable sheet 211 that are positioned at both ends in the second direction 222 to a predetermined temperature or higher. In other words, the control unit 80 controls the heating unit 60 to heat areas of the expandable sheet 211 that exist in directions in which the expandable sheet 211 is to be expanded more than in other directions. Then, the control unit 80 cools the portions of the annular area 212 of the expandable sheet 211 that are positioned at both ends in the second direction 222, making the portions harder than before they have been heated. By thus making the portions of the annular area 212 of the expandable sheet 211 that are positioned at both ends in the second direction 222, harder than the other portions of the annular area 212, subsequent expansion of the annular area 212 of the expandable sheet 211 in the second direction 222 is limited. In this manner, the method of processing the workpiece 201-2 according to the second modification can promote subsequent expansion of the area of the expandable sheet 211 that is affixed to the workpiece 201 in the second direction 222.

(Third Modification)

Figure 11:
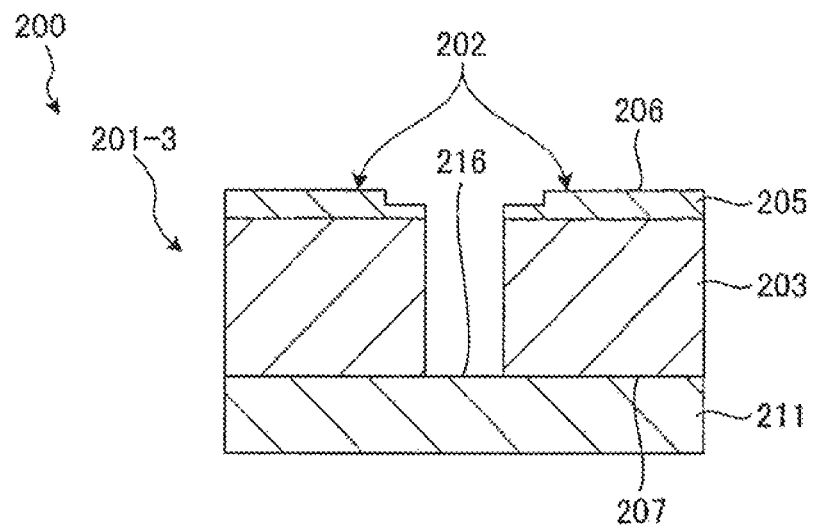
FIG. 11 is an enlarged fragmentary cross-sectional view of a workpiece whose chip interval is expanded by a method of processing a workpiece according to a third modification.

A method of processing a workpiece 201-3 according to a third modification of the present invention will be described below with reference to the drawings. FIG. 11 illustrates in enlarged fragmentary cross section a portion of the workpiece 201-3 whose chip interval is expanded by the method of processing the workpiece 201-3 according to the third modification. Those parts illustrated in FIG. 11 that are identical to those according to the embodiment are denoted by identical reference characters, and their description will be omitted below.

The workpiece 201-3 according to the third embodiment has division grooves 216 defined between the adjacent devices 205, and is divided into the individual chips 202 from the division grooves 216. The division grooves 216 may be formed according to an ablation process by applying a laser beam having a wavelength that can be absorbed by the workpiece 201-3 to the workpiece 201-3 along the projected dicing lines 204 (see FIG. 1 or 10) or according to a cutting process by causing a cutting blade to cut into the workpiece 201-3 along the projected dicing lines 204.

In the thermosetting step ST1 according to the third modification, as with the thermosetting step ST1 according to the embodiment, the annular area 212 of the expandable sheet 211 that lies around the workpiece 201 is heated to a predetermined temperature or higher, and thereafter cooled to make itself harder than before it has been heated. The annular area 212 of the expandable sheet 211 around the workpiece 201-3 is made harder than the area of the expandable sheet 211 that is affixed to the chips 202 and the areas of the expandable sheet 211 that lie between the adjacent chips 202.

In the expanding step ST2, the chip interval forming unit 50 (see FIG. 4 etc.) of the expanding apparatus 10 expands the expandable sheet 211 of the frame unit 200, increasing the intervals between the adjacent chips 202 to desired distances. At this time, the annular area 212 of the expandable sheet 211 around the workpiece 201-3 has been made harder than the area of the expandable sheet 211 that is affixed to the chips 202 and the areas of the expandable sheet 211 that lie between the adjacent chips 202. Consequently, in the method of processing the workpiece 201-3 according to the third modification, subsequent expansion of the annular area 212 of the expandable sheet 211 is limited whereas subsequent expansion of the areas of the expandable sheet 211 between the adjacent chips 202 is promoted.

(Fourth Modification)

Figure 12:
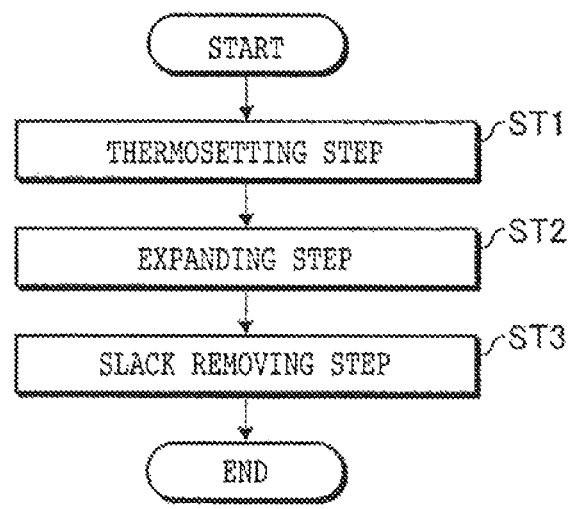
FIG. 12 is a flowchart of the sequence of a method of processing a workpiece according to a fourth modification.

A method of processing the workpiece 201 according to a fourth modification of the present invention will be described below with reference to the drawings. FIG. 12 is a flowchart of the sequence of the method of processing the workpiece 201 according to the fourth modification. As illustrated in FIG. 12, the method of processing the workpiece 201 includes the thermosetting step ST1, the expanding step ST2, and a slack removing step ST3. In other words, the method of processing the workpiece 201 further includes the slack removing step ST3 in addition to the method of processing the workpiece 201 according to the embodiment.

Figure 13:
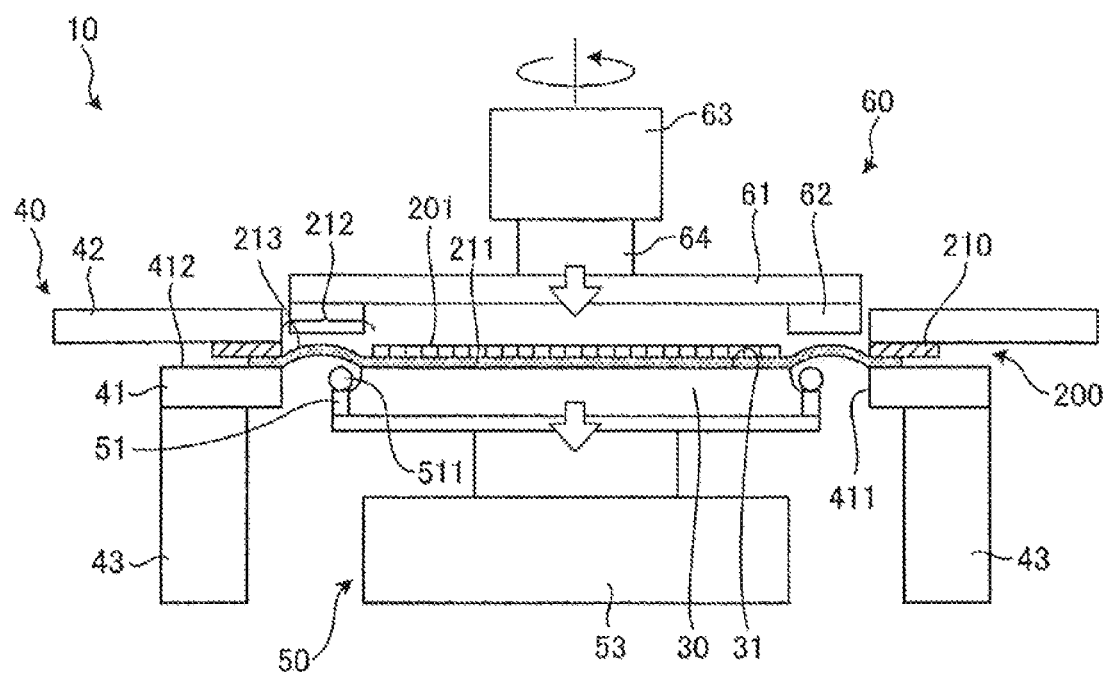
FIG. 13 is a cross-sectional view illustrating a portion of an expanding apparatus that is in a state in a slack removing step of the method of processing a workpiece illustrated in FIG. 12.
Figure 14:
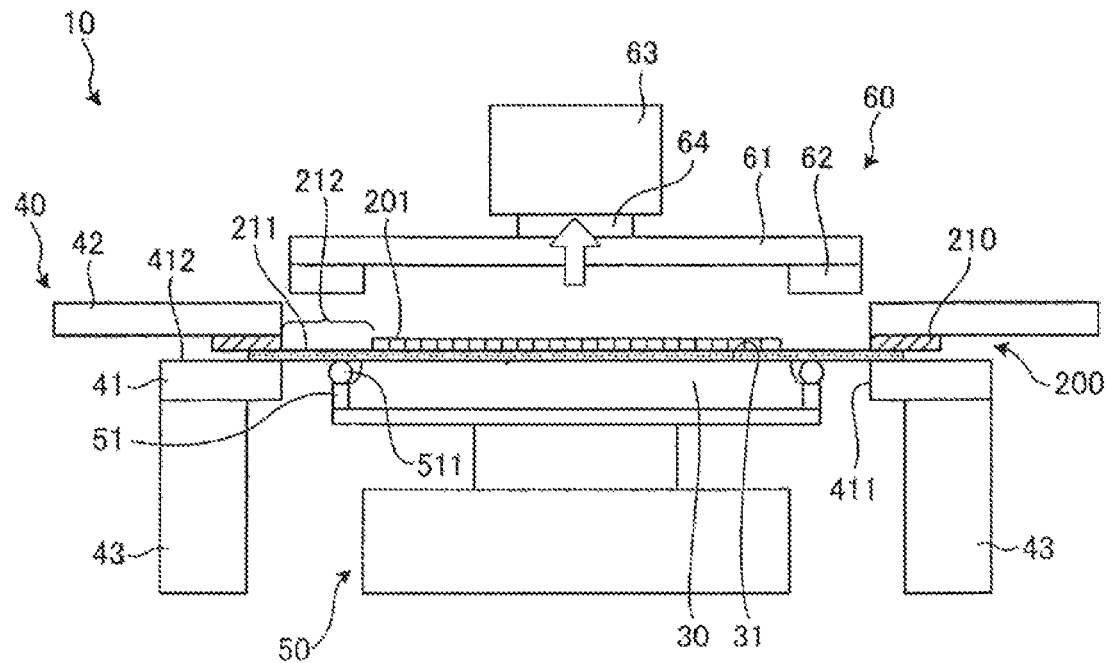
FIG. 14 is a cross-sectional view illustrating the portion of the expanding apparatus after the slack removing step of the method of processing a workpiece illustrated in FIG. 12.

FIG. 13 illustrates in cross section a portion of the expanding apparatus 10 that is in a state in the slack removing step ST3 of the method of processing the workpiece 201 illustrated in FIG. 12. FIG. 14 illustrates in cross section the portion of the expanding apparatus 10 after the slack removing step ST3 of the method of processing the workpiece 201 illustrated in FIG. 12. The slack removing step ST3 is a step of heating again and shrinking a slacked area of the expandable sheet 211 around the workpiece 201 after the expanding step ST2 is performed.

The slack removing step ST3 is carried out subsequently by the expanding apparatus 10 used to carry out the thermosetting step ST1 and the expanding step ST2 according to the embodiment or the first modification. In the slack removing step ST3 according to the fourth embodiment, while the slack in the expandable sheet 211 is being removed, the expandable sheet 211 needs to remain expanded. After the expanding step ST2 illustrated in FIG. 8, radial tensile forces act on the expandable sheet 211. At this time, the annular area 212 of the expandable sheet 211 extends straight in cross section from the lower surface of the annular frame 210 toward the upper surfaces of the rollers 511.

First, the control unit 80 actuates the vacuum suction source to attract the holding surface 31 of the chuck table 30 under suction. The chuck table 30 holds the reverse side 207 of the workpiece 201 under suction on the holding surface 31 with the expandable sheet 211 interposed therebetween. The control unit 80 thus keeps the intervals between the adjacent chips 202.

Next, the control unit 80 controls the table lifting and lowering unit 53 of the chip interval forming unit 50 to lower the push-up member 51 and the chuck table 30 in unison with each other. At this time, because the outer circumferential edge portion of the expandable sheet 211 is fixed in position between the frame rest plate 41 and the frame pressing plate 42, and the central area of the expandable sheet 211 is held under suction, the expandable sheet 211 forms a slacked portion 213 in the annular area 212, as illustrated in FIG. 13. At this time, the control unit 80 controls the lifting and lowering unit 64 to lower the unit body 61 of the heating unit 60 simultaneously with the chuck table 30.

In the slack removing step ST3, the control unit 80 heats the heat sources 62 of the heating unit 60 again to a predetermined temperature by applying a voltage to the heat sources 62. The predetermined temperature is a preset constant temperature and may not necessarily be the same as the heating temperature in the thermosetting step ST1. The heated heat sources 62 radiate infrared rays. As illustrated in FIG. 13, the control unit 80 brings the heat sources 62 of the heating unit 60 closely to the annular area 212 of the expandable sheet 211 and heats the heat sources 62 again. The control unit 80 controls the rotating unit 63 to rotate the heating unit 60 about its central axis to move the heat sources 62 circumferentially along the annular area 212 of the expandable sheet 211. At this time, the control unit 80 may control the lifting and lowering unit 64 of the heating unit 60 under conditions preset by the operator. For example, the control unit 80 may adjust the distance between the heat sources 62 and the expandable sheet 211 for increasing the amount of heat applied to the area that is slacked to a large extent and reducing the amount of heat applied to the area that is slacked to a small extent.

In the slack removing step ST3, the control unit 80 controls the heating unit 60 to heat the annular area 212 of the expandable sheet 211 expanded in the expanding step ST2. As the expandable sheet 211 shrinks when heated, the slack in the expandable sheet 211 is removed when the slacked portion 213 is heated, as illustrated in FIG. 14.

When the slack in the expandable sheet 211 has been removed, the slack removing step ST3 comes to an end. After the slack removing step ST3, the control unit 80 lifts the heating unit 60, stops heating the heat sources 62, and stops actuating the vacuum suction source. The control unit 80 controls the frame holder 40 to release the annular frame 210. Inasmuch as the slack in the expandable sheet 211 that has been expanded is removed, even when the holding surface 31 of the chuck table 30 stops holding the frame unit 200 under suction, the intervals between the adjacent chips 202 are kept.

In the method of processing the workpiece 201 according to the fourth modification, as described above, the expandable sheet 211 that has been slacked by the expansion between the annular frame 210 around the workpiece 201 and the plurality of chips 202 is shrunk by being heated again by the heating unit 60, thereby removing the slack in the expandable sheet 211. At this time, as the heat sources 62 used for heating the expandable sheet 211 in the thermosetting step ST1 and the heat sources 62 used for heating the expandable sheet 211 again in the slack removing step ST3 are shared in common, the heat sources 62 are used efficiently.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a plate-shaped workpiece that has division initiating points formed therein along projected dicing lines thereon or that has been divided into a plurality of chips, the workpiece being disposed in an opening of an annular frame and supported on an expandable sheet having a thermosetting material and fixed directly to the annular frame, thereby making up a frame unit, the expandable sheet capable of being expanded to divide the workpiece into individual chips from the division initiating points or to increase distances between the adjacent chips, the method comprising:

a thermosetting step of heating an area of the expandable sheet around the workpiece to a predetermined temperature or higher and thereafter cooling the heated area of the expandable sheet to harden the area of the expandable sheet around the workpiece; and after the thermosetting step, an expanding step of expanding the area of the expandable sheet around the workpiece in planar directions to divide the workpiece into the chips or to increase distances between the adjacent chips, wherein the thermosetting step limits an expansion of the hardened area of the expandable sheet around the workpiece relative to an area of the expandable sheet on which the workpiece is disposed.

2. The method of processing a plate-shaped workpiece according to claim 1, wherein the expandable sheet includes a base layer and an adhesive layer, the base layer or the adhesive layer being made of a thermosetting resin.

3. The method of processing a plate-shaped workpiece according to claim 1, wherein the thermosetting step is carried out on areas of the expandable sheet that exist in directions in which the expandable sheet is to be expanded more than in other directions.

4. The method of processing a plate-shaped workpiece according to claim 1, further comprising:
   after the expanding step, a slack removing step of heating again the area of the expandable sheet around the workpiece that has been slacked to shrink the slacked area of the expandable sheet.

5. The method of processing a plate-shaped workpiece according to claim 1, wherein the expandable sheet is heated at an annular area surrounding the workpiece.

6. The method of processing a plate-shaped workpiece according to claim 1, wherein the heated area is cooled without a use of a cooling device.

7. The method of processing a plate-shaped workpiece according to claim 1, wherein the heated area is cooled to a room temperature.

* * * * *